(12) United States Patent
Gopinath et al.

(10) Patent No.: US 12,205,633 B2
(45) Date of Patent: Jan. 21, 2025

(54) NON-VOLATILE MEMORY DEVICE WITH REFERENCE VOLTAGE CIRCUIT INCLUDING COLUMN(S) OF REFERENCE BIT CELLS ADJACENT COLUMNS OF MEMORY BIT CELLS WITHIN A MEMORY CELL ARRAY

(71) Applicant: GlobalFoundries U.S. Inc., Malta, NY (US)

(72) Inventors: Venkatesh P. Gopinath, Freemont, CA (US); Xiaoli Hu, Shanghai (CN); Thomas Melde, Dresden (DE); Nicki N. Mika, Dresden (DE)

(73) Assignee: GlobalFoundries U.S. Inc., Malta, NY (US)

( * ) Notice: Subject to any disclaimer, the term of this patent is extended or adjusted under 35 U.S.C. 154(b) by 150 days.

(21) Appl. No.: 17/806,792

(22) Filed: Jun. 14, 2022

(65) Prior Publication Data

US 2023/0402091 A1 Dec. 14, 2023

(51) Int. Cl.
*G11C 11/4099* (2006.01)
*G11C 11/4091* (2006.01)
*G11C 11/4094* (2006.01)
*G11C 11/4097* (2006.01)
*G11C 11/56* (2006.01)

(52) U.S. Cl.
CPC ...... *G11C 11/4099* (2013.01); *G11C 11/4091* (2013.01); *G11C 11/4094* (2013.01); *G11C 11/4097* (2013.01); *G11C 11/5635* (2013.01)

(58) Field of Classification Search
None
See application file for complete search history.

(56) References Cited

U.S. PATENT DOCUMENTS

| | | | | |
|---|---|---|---|---|
| 5,493,533 A | * | 2/1996 | Lambrache | G11C 7/067 365/207 |
| 6,111,781 A | * | 8/2000 | Naji | G11C 11/15 365/158 |
| 6,269,040 B1 | * | 7/2001 | Reohr | G11C 7/18 365/201 |
| 6,331,943 B1 | * | 12/2001 | Naji | G11C 11/15 365/158 |
| 6,643,177 B1 | | 11/2003 | Le et al. | |
| 7,864,563 B2 | * | 1/2011 | Shimizu | G11C 29/52 365/158 |
| 8,867,279 B2 | | 10/2014 | Tsai et al. | |
| 9,305,643 B2 | | 4/2016 | Gopinath et al. | |

(Continued)

OTHER PUBLICATIONS

Melde et al., "Novel Embedded Single Poly Floating Gate Flash Demonstrated in 22nm FDSOI Technology," IEEE, 2021, pp. 1-4.

(Continued)

*Primary Examiner* — J. H. Hur
(74) *Attorney, Agent, or Firm* — David Cain; Hoffman Warnick LLC

(57) ABSTRACT

Structures herein include an array of non-volatile memory cells. The non-volatile memory cells include memory bit cells and at least one reference bit cell that is adjacent the memory bit cells. These structures also include at least one reference voltage regulator connected to the reference bit cell, and at least one sense amplifier connected to the memory bit cells and the reference voltage regulator.

6 Claims, 6 Drawing Sheets

(56) References Cited

U.S. PATENT DOCUMENTS

| | | | | |
|---|---|---|---|---|
| 2002/0101760 A1* | 8/2002 | Naji | ................ | G11C 11/1657 |
| | | | | 365/158 |
| 2004/0032759 A1* | 2/2004 | Chow | ................ | G11C 11/22 |
| | | | | 365/145 |
| 2005/0105358 A1* | 5/2005 | Schweickert | ........ | G11C 11/22 |
| | | | | 365/222 |
| 2009/0040820 A1* | 2/2009 | Chao | ................ | G11C 13/004 |
| | | | | 365/163 |
| 2010/0054019 A1* | 3/2010 | Toda | ................ | G11C 13/00 |
| | | | | 365/207 |
| 2014/0063931 A1* | 3/2014 | Willey | ............ | G11C 13/0069 |
| | | | | 365/163 |
| 2016/0300604 A1* | 10/2016 | Lee | .............. | H10B 61/22 |
| 2018/0350419 A1* | 12/2018 | Koike | ............ | G11C 11/161 |
| 2021/0012834 A1* | 1/2021 | Hsu | .............. | G11C 16/08 |
| 2023/0178172 A1* | 6/2023 | Yun | ................ | G11C 29/846 |
| | | | | 714/719 |

OTHER PUBLICATIONS

Motwani et al., "Estimation of Flash Memory Level Distributions Using Interpolation Techniques for Optimizing the Read Reference," IEEE, 2015, pp. 1-6.

* cited by examiner

NON-VOLATILE MEMORY DEVICE WITH REFERENCE VOLTAGE CIRCUIT INCLUDING COLUMN(S) OF REFERENCE BIT CELLS ADJACENT COLUMNS OF MEMORY BIT CELLS WITHIN A MEMORY CELL ARRAY

BACKGROUND

Field of the Invention

The present disclosure relates to non-volatile memories and more specifically to reference voltage circuits within non-volatile memories.

Description of Related Art

Non-volatile memory devices are electrically programmable/erasable and are able to retain stored data when power is terminated. Flash memory is one type of non-volatile memory that uses a floating-gate MOSFETs (metal oxide semiconductor field effect transistors) to store data. Flash memory storage can include NAND flash and solid-state drives (SSD). Other examples of non-volatile memory include read-only memory (ROM), EPROM (erasable programmable ROM) and EEPROM (electrically erasable programmable ROM), ferroelectric RAM, etc.

Flash memory devices change the data value stored by a memory cell by controlling the quantity of charge accumulated on the charge storage layer of the memory cell. Flash memories are generally cycled through erase, program, and read operations.

An erase operation may be performed in relation to a cell transistor by applying a ground voltage to the control gate and by applying a voltage higher than a constituent power supply voltage to the semiconductor substrate (or bulk). Under these erase bias conditions a strong electric field is formed between the charge storage layer and the semiconductor bulk due to a large difference in the electrical resistances. As a result, charge accumulated on the charge storage layer is discharged, and the critical voltage of the erased cell transistor decreases.

A programming operation may be performed in relation to the cell transistor by applying a voltage higher than the power supply voltage to the control gate and applying a ground voltage to the drain, as well as the semiconductor bulk. Under these programming bias conditions charge accumulates on the charge storage layer and the critical voltage of the cell transistor increases.

Hence, a memory cell state in which charge is relatively absent from the charge storage layer and the corresponding critical voltage of the cell transistor is negative is conventionally referred to as an erased state. Further, a memory cell state in which charge accumulates on the charge storage layer and the corresponding critical voltage of the cell transistor is greater than zero is referred to as a programmed state.

SUMMARY

Structures herein include an array of non-volatile memory cells. The non-volatile memory cells include memory bit cells and at least one reference bit cell that is adjacent the memory bit cells. These structures also include at least one reference voltage regulator connected to the reference bit cell, and at least one sense amplifier connected to the memory bit cells and the reference voltage regulator.

Additional structures herein similarly have an array of non-volatile memory cells. The non-volatile memory cells include memory bit cells and reference bit cells. Further, wordlines and bitlines are connected to the non-volatile memory cells. The bitlines include memory cell bitlines connected to the memory bit cells, and reference cell bitlines connected to the reference bit cells. At least one reference voltage regulator is connected to the reference cell bitlines and at least one sense amplifier is connected to the memory cell bitlines and the reference voltage regulator.

Other structures herein similarly include an array of non-volatile memory cells that include memory bit cells and reference bit cells. Again, wordlines and bitlines are connected to the non-volatile memory cells. In this structure, the bitlines include memory cell bitlines connected to the memory bit cells, and reference cell bitlines connected to the reference cell bitlines. The reference cell bitlines are physically between ones of the memory cell bitlines. Also, in this structure, at least one reference voltage regulator is connected to the reference cell bitlines and at least one sense amplifier is connected to the memory cell bitlines and the reference voltage regulator.

BRIEF DESCRIPTION OF THE DRAWINGS

The embodiments herein will be better understood from the following detailed description with reference to the drawings, which are not necessarily drawn to scale and in which.

DETAILED DESCRIPTION

Figure 1:
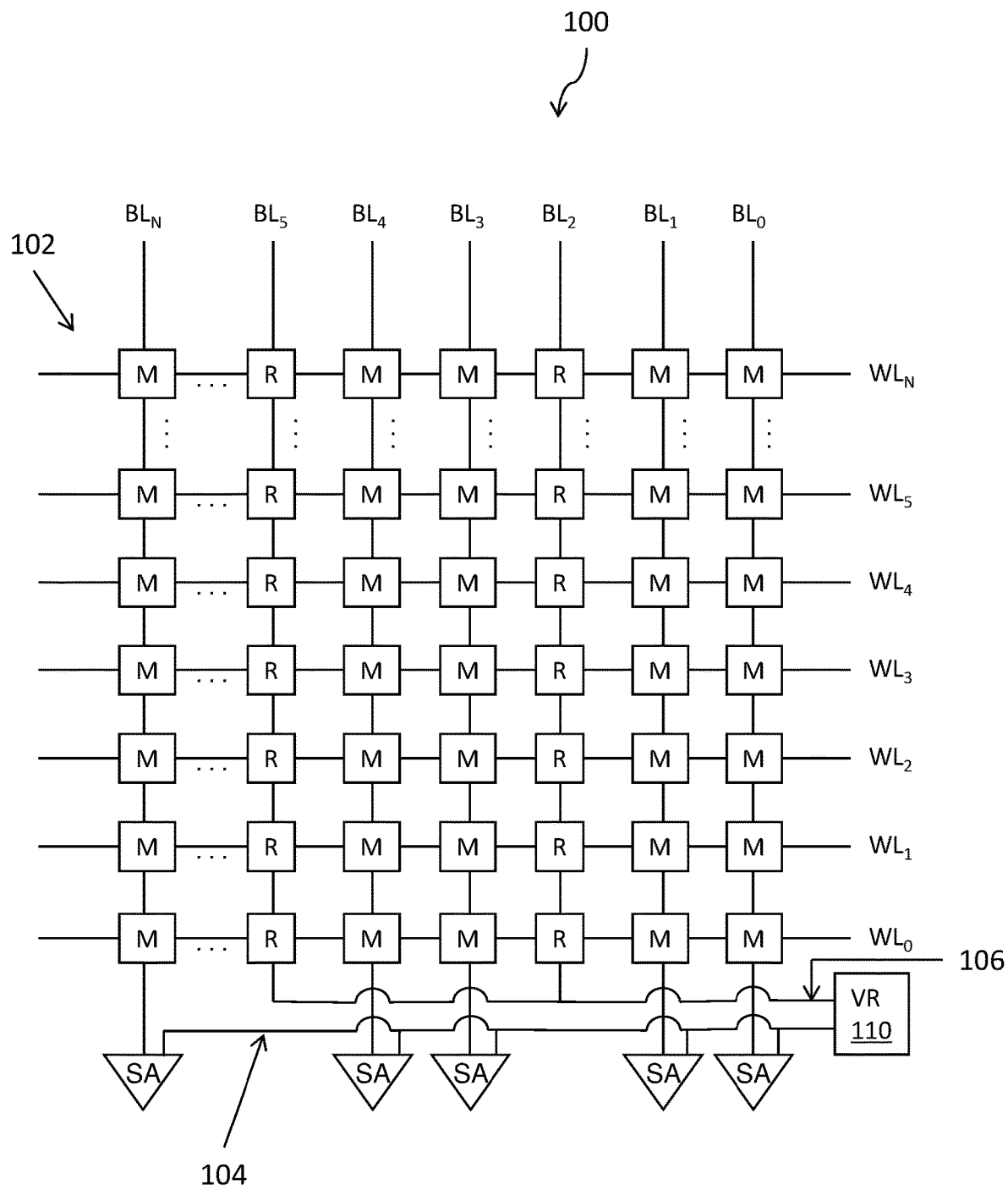
FIGS. 1-5 are schematic diagrams illustrating non-volatile memory arrays according to embodiments herein.

As noted above, non-volatile memories are highly useful when data is maintained after power is terminated. In such memory arrays, a reference voltage source (e.g., a "read reference") is used by a sense amplifier to determine the data value being read from the array. One issue with non-volatile memories is that the variable read reference for an array should track the endurance and retention window drift of the memory cells within the array. Normally, fixed read references are used which do not "age" or track the actual array memory cells undergoing endurance or cycling. In view of this, the structures disclosed herein provide variable (endurance and retention tracking) read reference cells.

Some non-volatile memory arrays use one or more reference cells that are fixed in value. This only works if the window closure (between read and write operations) are symmetrical and repeatable between program and erase operations. Also, each bit has a threshold voltage spread, so a large number of bits in each state of charge are needed to provide a reliable mid-point. Additionally, in these structures the reference cells are susceptible to thermal drift when they are not reset, resulting in a drifting reference voltage. In such arrays, the reference cells themselves do not experience endurance (a measure of how many write/erase cycles can be performed before failures occur), so they do not track the actual array/sector endurance.

Further, some systems condition the reference cells differently from the memory cells of the main array. Such reference cells do not track the main array, and there the intent is to make the threshold voltage spread of the reference cells significantly narrower that the threshold voltage spread of the memory cells in the main array, allowing the main array margin to spread out later in an effort to improve endurance, retention (amount of time that cells maintain their data values) or a combination of endurance and retention. This requires multiple control circuits, some for normal memory read, erase, and write operations and others for maintaining the values of the reference cells.

In other systems, one or more reference columns, separate from the memory array, are used to generate a reference current. This requires an additional wordline and other cells not on the reference wordline are used to augment the reference signal. This does not use array cells in a data wordline and, therefore, does not cycle (e.g., erase, write, and read operations) the wordline with the array wordlines, which prevents the reference wordline from aging with the data wordlines in the array.

The structures herein address the issues of conventional structures by using data memory cells within the array as reference cells to generate a reference value that is supplied to the sense amplifier. This allows the reference cell to track both endurance and retention characteristics of the other data memory cells within the array. The structures herein can use a variable reference setting that tracks the behavior of the main cells under both thermal stress and endurance conditions.

The reference cell can be a standalone bit cell implementation providing a reference for the entire array or a row or column of cells. The reference cells can also be embedded into a fraction of an array, for example, at an edge of a row. Thus, the reference cells are extra bits of the same basic element of memory (word, page, sector, etc.) of the memory array and can be, for example, distributed in wordlines. With this physical positioning, the reference cells are addressed at the same time as the main data. Thus, the reference cells herein are always cycled in unison with the main array.

Further, when providing multiple reference cells, some of the reference cells can be programmed and the others can be erased. In one example, the reference cells include multiple programmed "0" cells and multiple erased "1" cells to track aging from both ends of the memory usage. Having multiple programmed "0" and erased "1" cells averages out any random variation within the reference cells.

Most non-volatile memory architectures are erased before being programed. Further, while individual memory cells (bits) or wordlines are written individually, in contrast erase operations are applied to all bits in an array, sub-array, page, etc., in unison. Thus, after each erase operation, all reference cells will be erased and a subsequent programming operation automatically sets the charge of the programmed reference cells.

With structures herein a current te voltage current-to-voltage converter combines the currents from the multiple programmed and erased reference cells to produce a midpoint voltage that the sense amplifier can compare to the voltage produced from the current flowing through the selected memory cell. Further, in some embodiments herein some of the reference bit cells are selectively subjected to erase only, erase and programming, or programming only.

Therefore, with the structures described below, each time the memory cells in the array are erased and programmed, the reference cells are also erased and programmed. This maintains the reference cells in the same aged condition as the memory cells and causes the reference cells and the memory cells to have the same endurance and retention characteristics. In this way, the read reference voltage supplied by the reference cells is consistent with the voltages maintained by the memory cells in the same array, and this makes the voltage comparison performed by the sense amplifier more consistent when compared to structures that use separate reference cells positioned outside the memory array to generate the reference voltage.

In other words, if the historical array usage (e.g., temperature cycles, erase cycles, time length since the last erase/write cycle, etc.) have altered the way in which the memory cells in an array maintain a written or erased voltage, because the reference cells have also experienced the same historical array usage, the reference voltages maintained in the reference cells will be affected in the same way the memory cells were affected. Additionally, since any given word, wordline, or sector will be at different state of endurance at any given time, the structures herein afford a more granular, customized reference voltage.

Thus, when the sense amplifier uses the reference voltage from the reference cells (potentially altered by the historical array usage) to compare to the voltage read from a memory cell (similarly potentially altered by the same historical array usage), the comparison will be more accurate because both voltages have been altered in the same way. Conventional structures that maintain fixed, non-altered reference voltage structures will produce less accurate comparisons, especially if the voltage read from the memory cell has been altered greatly by the effects of historical array usage.

Structures disclosed herein offer designers a significantly larger read window because the read window does not need to be conservatively set. Instead, with the structures herein the window is maximized at any given endurance or retention history because the reference cells mimic the behavior of the memory cells that share the same array. This allows the structures herein to automatically compensate for areas of arrays that see more use or less use. Thus, for example, if certain wordlines are operated more than others, only the reference cells of these specific wordlines experience the same additional use and aging, and this allows the reference cells and the associated wordlines to age the same amount (e.g., be identically altered by the same historical array usage).

FIG. 1 illustrates an exemplary embodiment herein where a structure 100 includes an array 102 of non-volatile memory cells M, R that are either memory bit cells M or reference bit cells R. Wordlines WL (shown as $WL_0$-$WL_N$) and bitlines BL (shown as $BL_0$-$BL_N$) are connected to the non-volatile memory cells M, R.

In this structure 100, certain ones of the bitlines BL are classified as memory cell bitlines $BL_0$, $BL_1$, $BL_3$, $BL_4$, $BL_N$ because such bitlines BL are connected to the memory bit cells M. The remaining ones of the bitlines BL are classified as reference cell bitlines $BL_2$ and $BL_5$ because such bitlines BL are connected to the reference bit cells R. As can be seen in FIG. 1, The reference cell bitlines $BL_2$ and $BL_5$ are physically between ones of the memory cell bitlines $BL_0$, $BL_1$, $BL_3$, $BL_4$, $BL_N$ and are within (internal to) the memory cell array 102 and not outside (not external) of the memory cell array 102.

Also, in this structure 100, at least one reference voltage regulator 110 is connected to the reference cell bitlines $BL_2$ and $BL_5$ by way of a reference current line 106. At least one sense amplifier SA is connected to the ends of the memory cell bitlines $BL_0$, $BL_1$, $BL_3$, $BL_4$, $BL_N$ and the reference voltage regulator 110. A reference voltage line 104 connects the sense amplifiers SA to the reference voltage regulator 110.

Here, the memory bit cells M and the reference bit cells R are physically identical and the reference cell bitlines $BL_2$ and $BL_5$ are evenly distributed within the array 102. Note that FIG. 1 only shows a very small portion of the array 102 and there are actually many more than the two reference cell bitlines $BL_2$ and $BL_5$ shown in FIG. 1. Additionally, only the reference bit cells R are connected to the reference cell bitlines $BL_2$ and $BL_5$ and vice versa (e.g., the reference bit cells R are only connected to the reference cell bitlines $BL_2$ and $BL_5$).

The wordlines WL and bitlines BL are connected to the non-volatile memory cells M, R so that the memory bit cells M and the reference bit cells R are erased together. Global Iref is the total current from all the reference cells R on the selected row appearing on the reference current line 106, including "0" ref cells and "1" ref cells. The reference voltage regulator 110 converts the reference current Iref from the reference cells R into a reference voltage Vref (which can be based on the certain percentage of the reference current Iref). The percentage is set by the targeted trip point and can be trimmed. The sense amplifier SA receives the voltage reference Vref, generates a local reference current (which is a certain percentage of the reference current Iref) and compares local reference current to the current from the memory cell M that is being sensed in order to output a data value (Dout).

Figure 2:
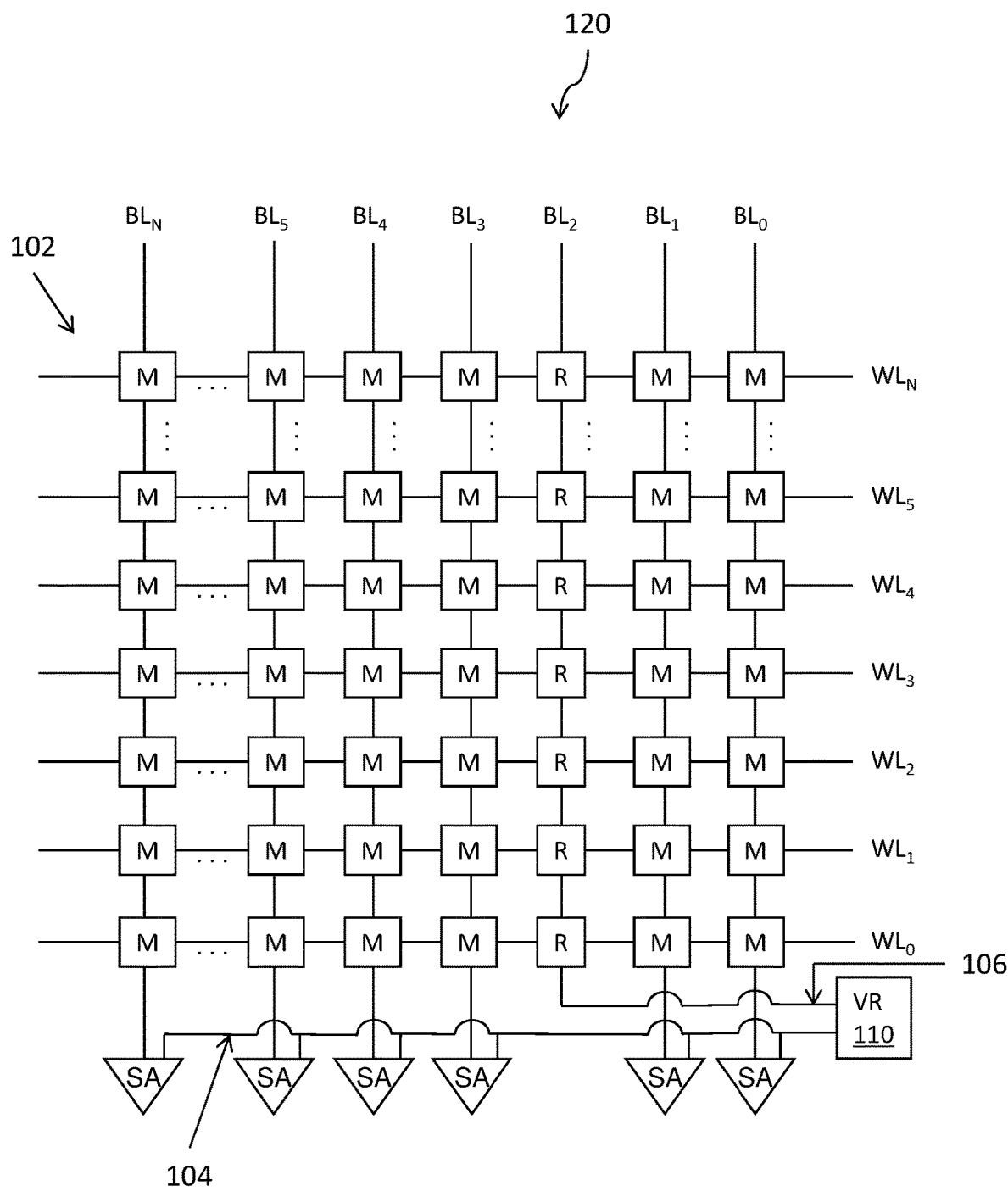
Figure 3:
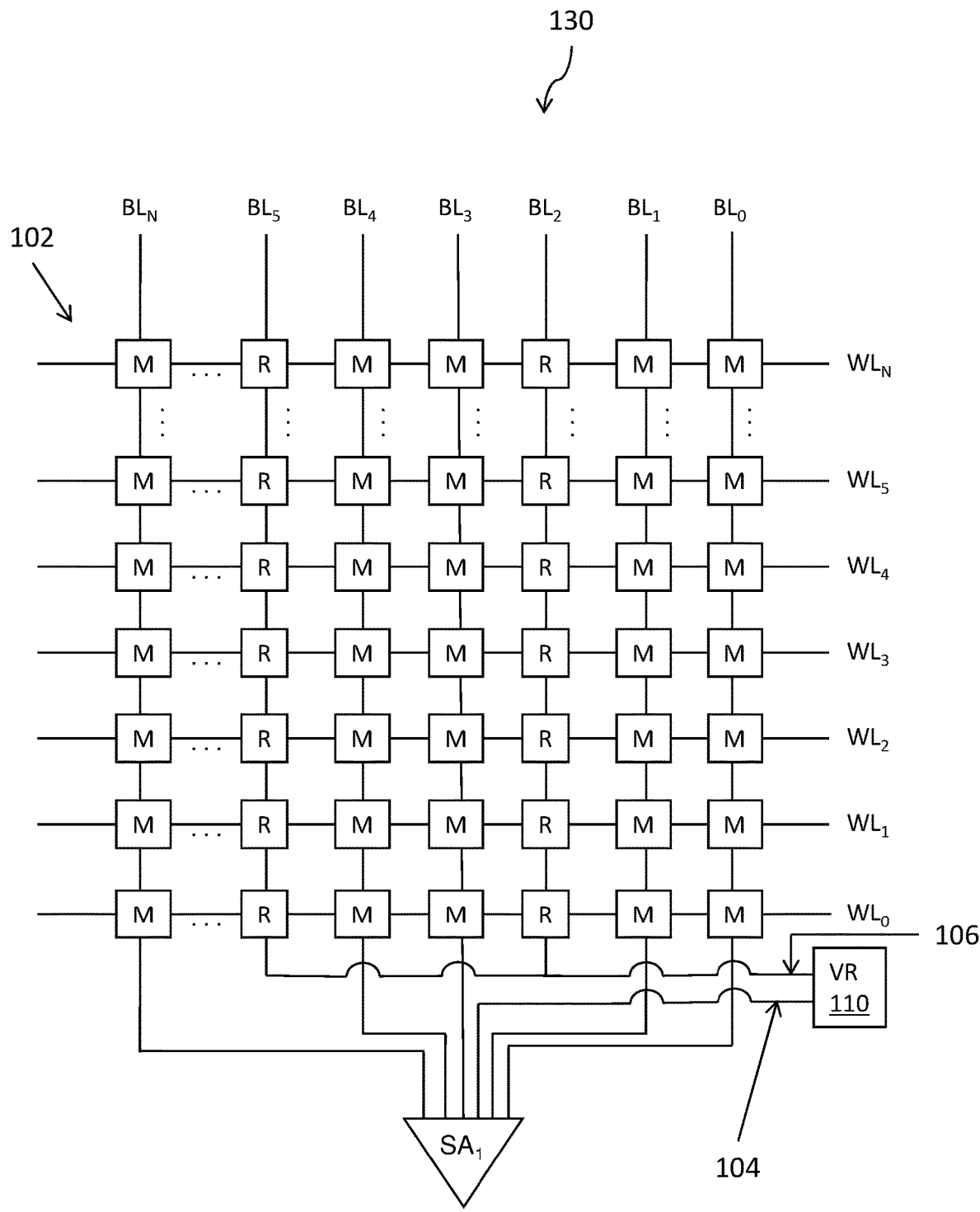

FIG. 2 illustrates a similar structure 120 to the structure 100 shown in FIG. 1, with all other identically referenced items being the same as is discussed above with FIG. 1; however, in FIG. 2 only a single reference cell bitline $BL_2$ is illustrated. Thus, FIG. 2 illustrates that as little as a single reference bitline $BL_2$ within the array 102 can be utilized to achieve the benefits produced by structures herein. FIG. 3 also illustrates a similar structure 130 to the structure 100 shown in FIG. 1, with all other identically referenced items being the same as is discussed above with FIG. 1; however, in FIG. 3 a single sense amplifier $SA_1$ is utilized in place of the multiple sense amplifiers SA shown in FIG. 1.

As is understood by those ordinarily skilled in the art, when non-volatile memories are read, all bitlines BL and one of the wordlines WL can be activated. This allows each individual sense amplifier SA shown in FIGS. 1 and 2 to individually read from the selected memory bit cell M within the bitline BL to which each individual sense amplifier is connected. In other words, in the structure shown in FIGS. 1 and 2, the memory bit cell M along the single activated wordline WL is read by a corresponding sense amplifier SA to which the memory bit cell M is connected.

In contrast, in the structure shown in FIG. 3, the single sense amplifier SA1 is connected to all bitlines BL and therefore the single sense amplifier SA1 is structured to sequentially read the current flowing on each sequential bitline BL to which it is connected to determine the value stored within each selected memory bit cell M of the activated wordline WL.

Figure 4:
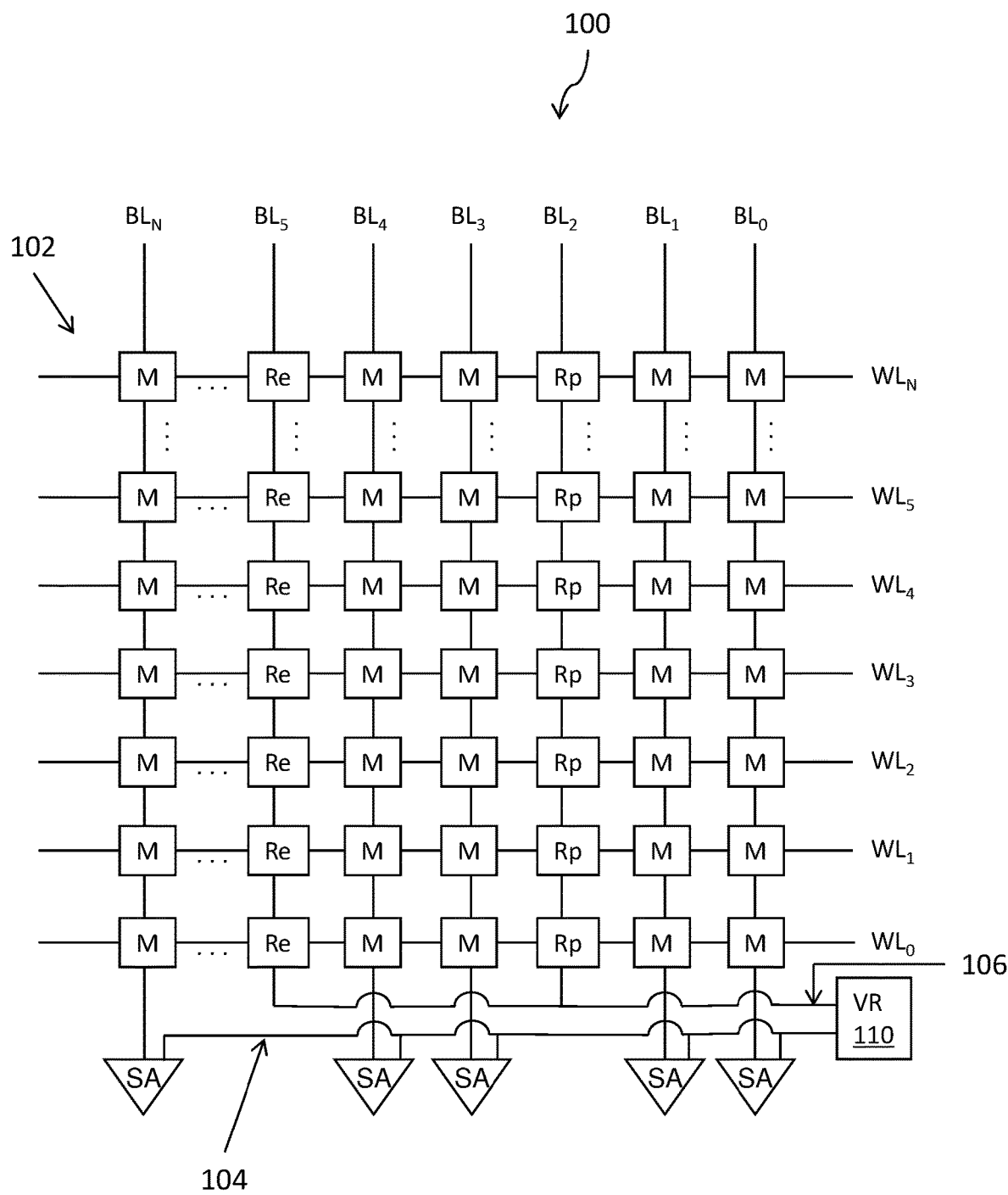

FIG. 4 shows the same structure 100 as that shown in FIG. 1; however, the erased/programmed state of each of the reference cells is shown in FIG. 4. Specifically, if a reference bit cell is labeled in FIG. 4 as Rp, that reference bit cell Rp is programmed, while if a reference bit cell is labeled in FIG. 4 as Re, that reference bit cell Re is erased. As is understood, a programmed reference bit cell Rp will not allow current to pass, resulting in a "0" data voltage value being output by the connected sense amplifier SA. In contrast, an erased reference bit cell Re will allow current to pass, resulting in a "1" data voltage value being output by the connected sense amplifier SA.

Figure 5:
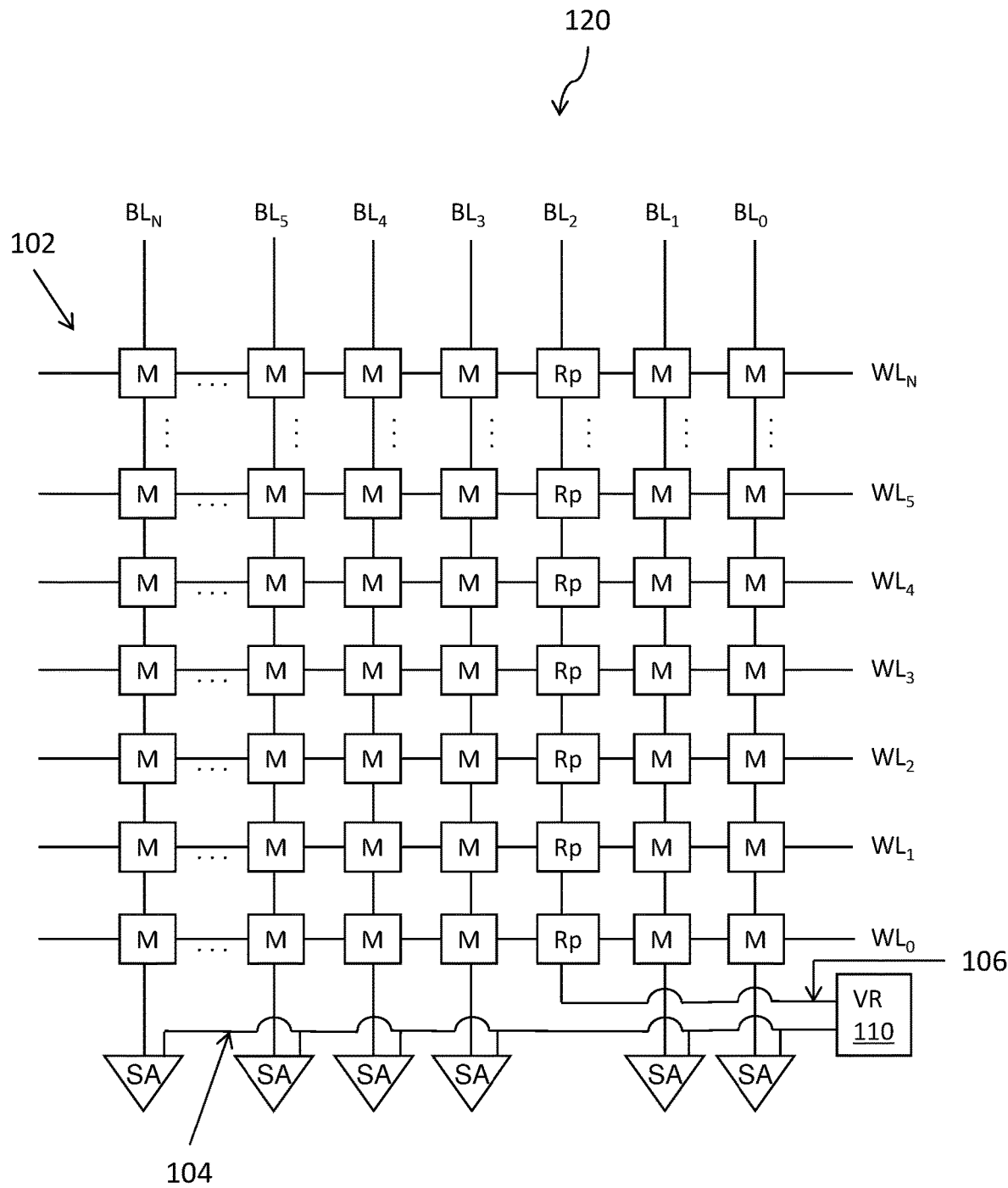

FIG. 5, shows the single column of reference bit cells structure 120 shown in FIG. 2 but where the erased (Re) programmed (Rp) state of each of the reference bit cells is shown. In the example shown in FIG. 5, all the reference bit cells in the single bitline $BL_2$ that contains the reference bit cells are programmed reference bit cells Rp. However, in an alternative (not shown) all the reference bit cells in the single bitline $BL_2$ that contains the reference bit cells could all be erased reference bit cells Re.

Thus, when a single one of the wordlines WL is activated during a read operation, the voltage regulator 110 will be supplied with a "0" current level, which causes the voltage regulator 110 to output a low voltage reference to all the sense amplifiers SA. In alternatives where all reference bit cells are erased, reference bit cells Re, the voltage regulator 110 outputs a high reference voltage Vref to all the sense amplifiers SA. In these structures, the sense amplifiers SA are structured to (adapted to) compare the current/voltage from the selected memory bit cell M to either the high or low voltage reference to determine whether the selected memory bit cell M should be identified as having a "0" or "1" data value (Dout).

Figure 6:
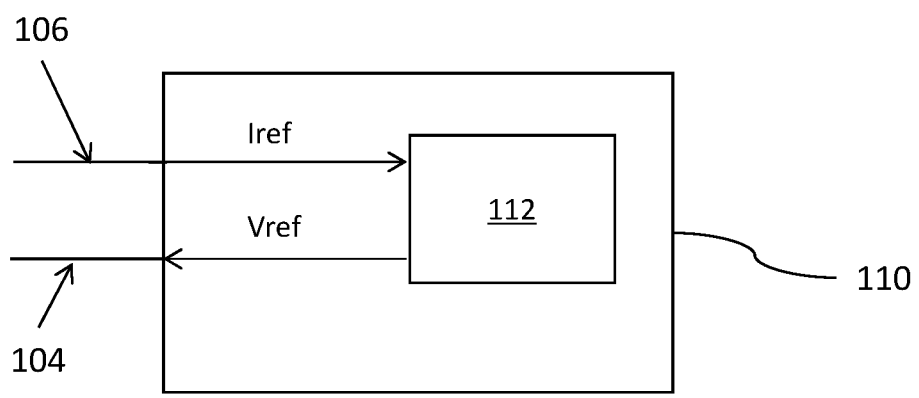
FIG. 6 is a schematic diagram of a voltage regulator according to embodiments herein.

As shown in FIG. 6, the reference voltage regulator 110 has a current to voltage converter 112 connected to receive one or more reference currents Iref from the reference cell bitlines along the reference current line 106. The current to voltage converter 112 is adapted to convert the reference currents Iref into a reference voltage Vref. Further, as shown in FIG. 6, the current to voltage converter 112 is connected to supply the reference voltage Vref to the reference voltage line 104.

The terminology used herein is for the purpose of describing particular embodiments only and is not intended to be limiting of the foregoing. As used herein, the singular forms "a," "an," and "the" are intended to include the plural forms as well, unless the context clearly indicates otherwise. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "in direct contact", "abutting", "directly adjacent to", "immediately adjacent to", etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element.

Embodiments herein may be used in a variety of electronic applications, including but not limited to advanced sensors, memory/data storage, semiconductors, microprocessors and other applications. A resulting device and structure, such as an integrated circuit (IC) chip can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The description of the present embodiments has been presented for purposes of illustration and description but is not intended to be exhaustive or limited to the embodiments in the form disclosed. Many modifications and variations will be apparent to those of ordinary skill in the art without departing from the scope and spirit of the embodiments herein. The embodiments were chosen and described in order to best explain the principles of such, and the practical application, and to enable others of ordinary skill in the art to understand the various embodiments with various modifications as are suited to the particular use contemplated.

The elements herein can be modified to incorporate any number of variations, alterations, substitutions or equivalent arrangements not heretofore described, but which are commensurate with the spirit and scope herein. Additionally, while various embodiments have been described, it is to be understood that aspects herein may be included by only some of the described embodiments. Accordingly, the claims below are not to be seen as limited by the foregoing description. All structural and functional equivalents to the elements of the various embodiments described throughout this disclosure that are known or later, come to be known, to those of ordinary skill in the art are expressly incorporated herein by reference and intended to be encompassed by this disclosure. It is therefore to be understood that changes may be made in the particular embodiments disclosed which are within the scope of the foregoing as outlined by the appended claims.

What is claimed is:

1. A structure comprising:
an array of non-volatile memory cells arranged in columns and rows, wherein the columns of the non-volatile memory cells in the array include columns of memory bit cells and columns of reference bit cells, and wherein, within the array, at least one column of the columns of the memory bit cells is between any two columns of the columns of the reference bit cells;
wordlines connected to the non-volatile memory cells in the rows, respectively;
bitlines connected to the non-volatile memory cells in the columns, respectively, wherein the bitlines comprise memory cell bitlines connected to the columns of the memory bit cells, respectively, and reference cell bitlines connected to the columns of the reference bit cells, respectively;
a reference current line electrically connected to each of the reference cell bitlines;
a reference voltage line;
one reference voltage regulator having an input and an output, wherein the input is electrically connected to the reference current line to receive reference currents from the reference cell bitlines, and wherein the output is electrically connected to the reference voltage line and outputs a reference voltage on the reference voltage line; and
sense amplifiers, wherein each sense amplifier has two inputs electrically connected to a corresponding one of the memory cell bitlines and to the reference voltage line, respectively.

2. The structure according to claim 1, wherein, within the array, the columns of the reference bit cells are distributed amongst the columns of the memory bit cells with each column of the columns of the reference bit cells being between two successive columns of the columns of the memory bit cells.

3. The structure according to claim 1, wherein only the reference bit cells are connected to the reference cell bitlines.

4. The structure according to claim 1, wherein the one reference voltage regulator comprises a current-to-voltage converter configured to convert the reference currents to the reference voltage.

5. The structure according to claim 1, wherein the wordlines and the bitlines are connected to the non-volatile memory cells in the array to have the memory bit cells and the reference bit cells erased together.

6. The structure according to claim 1, wherein the memory bit cells in the columns of the memory bit cells and the reference bit cells in the columns of the reference bit cells are physically identical.

* * * * *